(12) United States Patent
Park et al.

(10) Patent No.: US 6,287,971 B1
(45) Date of Patent: Sep. 11, 2001

(54) METHOD FOR FORMING A CELL CAPACITOR IN DRAM DEVICE

(75) Inventors: Jong-woo Park, Seoul; Kang-yoon Lee, Seongnam, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/266,990

(22) Filed: Mar. 12, 1999

(30) Foreign Application Priority Data

Mar. 12, 1998 (KR) .................................................. 98-8357

(51) Int. Cl.⁷ .................................................. H01L 21/302
(52) U.S. Cl. .................. 438/689; 438/692; 438/706; 438/719; 438/723; 438/724
(58) Field of Search .................................... 438/689, 692, 438/695, 740, 704, 724, 253, 706, 723, 719

(56) References Cited

U.S. PATENT DOCUMENTS

| | | | |
|---|---|---|---|
| 5,488,011 | * | 1/1996 | Figura et al. .......................... 438/253 |
| 5,936,272 | * | 8/1999 | Lee ........................................ 257/306 |
| 5,956,587 | * | 9/1999 | Chen et al. ............................ 438/255 |
| 6,040,215 | * | 3/2000 | Takaishi ................................ 438/253 |

FOREIGN PATENT DOCUMENTS 04265785   4/1994  (JP) .
08036409   9/1997  (JP) .

* cited by examiner

Primary Examiner—Felisa Hiteshew
Assistant Examiner—Binh X. Tran
(74) Attorney, Agent, or Firm—Marger Johnson & McCollom, P.C.

(57) ABSTRACT

A method for forming a cell capacitor in a DRAM device is provided. An interlayer insulating film is formed on a semiconductor substrate. The interlayer insulating film is patterned to form first buried contact holes for exposing a predetermined region of the semiconductor substrate. Plug patterns are filled in the first buried contact holes, and an etch stop film is formed on the entire surface of the resultant structure on which the plug patterns are formed. The etch stop film is patterned to form second buried contact holes having a smaller diameter than the top diameter of the plug patterns for exposing a predetermined region of the plug patterns. Storage electrodes for covering the second buried contact holes are formed on the resultant structure on which the second buried contact holes are formed. Also, the first buried contact holes can be formed by sequentially forming an interlayer insulating film and a first etch stop film on a semiconductor substrate and successively patterning the first etch stop film and the interlayer insulating film. Here, plug patterns for filling the first buried contact holes are formed, and a second etch stop film is formed on the entire surface of the resultant structure on which the plug patterns are formed. The second etch stop film is patterned to form second buried contact holes for exposing a predetermined region of the plug patterns. Storage electrodes for covering the second buried contact holes are formed.

27 Claims, 4 Drawing Sheets

METHOD FOR FORMING A CELL CAPACITOR IN DRAM DEVICE

BACKGROUND OF THE INVENTION

1. Field of the Invention

The present invention relates to a fabrication method of a semiconductor device, and more particularly, to a method for forming a cell capacitor in a DRAM device.

2. Description of the Related Art

A memory device such as a DRAM in a semiconductor device includes a unit cell comprised of an access transistor and a cell capacitor. The cell capacitor has a structure in which a storage electrode in electrical connection with a source region (or a drain region) of the access transistor, a dielectric film and a plate electrode are sequentially stacked. The capacitance of the cell capacitor has a direct relation to the electrical characteristics and reliability of a DRAM cell. In other words, an increase in cell capacitance causes an increase in the period of a refresh signal for preventing disappearance of information stored in the DRAM cell, and a reduction in a soft error rate (SER) due to an á-particle. Accordingly, when the cell capacitance is increased, power consumption of the DRAM device can be reduced, and the reliability of the DRAM cell can be improved. However, as the integration of the DRAM device is increased, the area occupied by a cell is decreased. Many methods have been proposed for forming a cell capacitor having large capacitance within a limited area. Basically, in order to increase the capacitance of a cell capacitor formed within the limited area, the surface area of the storage electrode must be increased or a thin dielectric film must be formed between the storage and plate electrodes. Alternatively, the dielectric film can be formed of a material having a high dielectric constant. However, when the thin dielectric film is formed, leakage current characteristics of a capacitor is degraded. When the dielectric film is formed of a material having a high dielectric constant, the process for fabricating a capacitor is complicated. Recently, a method has been widely used for increasing the surface area of the storage electrode by increasing the height of the storage electrode.

FIGS. 1 and 3 are cross-sectional views illustrating a method for forming a conventional storage electrode.

Referring to FIG. 1, a plurality of isolation films 3 are formed in a predetermined region of a semiconductor substrate 1. An interlayer insulating film 5, e.g., a planarized silicon oxide film, is formed on the resultant structure on which the plurality of isolation films 3 are formed. The interlayer insulating film 5 is patterned to form a plurality of buried contact holes (H) for exposing active regions between the isolation films 3. A DRAM cell bit line 7 can be formed inside the interlayer insulating film 5.

Referring to FIG. 2, a conductive film, e.g., a doped polysilicon film, for filling the buried contact holes H is formed on the entire surface of the resultant structure on which the buried contact holes H are formed. The conductive film is patterned to form a plurality of storage electrodes 9 for covering the respective buried contact holes H. Here, the conductive film is formed by an over etch process, in order to prevent residues of the conductive film from existing between the storage electrodes 9. Accordingly, as shown in FIG. 2, when mis-alignment occurs upon the photolithography for patterning the storage electrodes 9, a part of the conductive film inside the buried contact holes H is etched to form grooves (G). When the grooves G are formed in this way, a portion where the horizontal section of the storage electrode 9 is narrow exists on the upper portion of the buried contact holes H.

FIG. 3 is a cross-sectional view illustrating the step of cleaning the surface of the storage electrode 9. To be more specific, the resultant structure on which the storage electrodes 9 are formed is cleaned by a chemical solution, e.g., an oxide etchant to remove native oxide films formed on the surfaces of the storage electrodes 9 and contaminant particles. Here, the surface of the interlayer insulating film 5 is etched to form an undercut region under one edge of each of the storage electrodes 9. Also, as shown in FIG. 3, the storage electrodes 9 are lifted off since the upper portion thereof is easily broken. The lifted storage electrodes 9 pollute the surface of the semiconductor substrate, causing an abnormal pattern and reducing the electrical isolation characteristics between the storage electrodes 9.

According to the method for forming the conventional storage electrode as described above, when mis-alignment occurs upon the etch process for forming the storage electrode, the mid portion of the storage electrode has a narrow horizontal section. Thus, the storage electrodes are easily lifted, thereby contaminating the surface of the semiconductor substrate.

SUMMARY OF THE INVENTION

To solve the above problem, it is an objective of the present invention to provide a method for forming a cell capacitor in a DRAM device, by which the surface of a semiconductor substrate can be prevented from being contaminated.

Accordingly, to achieve the above objective, in the present invention, a plug pattern in contact with a predetermined region of the semiconductor substrate is formed on the semiconductor substrate, and a storage electrode contacting the plug pattern is formed. Here, the storage electrode may contact the upper surface of the plug pattern, or the upper side walls and upper surface of the plug pattern.

According to an embodiment of the present invention, an interlayer insulating film is formed on a semiconductor substrate. First buried contact holes for exposing a predetermined region of the semiconductor substrate are formed by patterning the interlayer insulating film. Here, preferably, the interlayer insulating film is a planarized silicon oxide film, i.e., a film selected from the group consisting of doped silica glass and undoped silica glass. Alternatively, the interlayer insulating film may be comprised of the doped silica glass and the undoped silica glass. The doped silica glass can be either a BPSG film or a PSG film. A conductive film, e.g., a doped polysilicon film, for filling the first buried contact holes, is formed on the entire surface of the resultant structure on the first buried contact holes are formed. The conductive film is entirely etched until the interlayer insulating film is exposed, to form plug patterns in the first buried contact holes. It is preferable that the entire etching is performed using a chemical mechanical polishing (CMP) process. Then, an etch stop film, e.g., a silicon nitride film, is formed on the entire surface of the resultant structure on which the plug patterns are formed. The etch stop film is patterned to form second buried contact holes for exposing the upper surface of the plug patterns. Here, it is preferable that the diameter of the second buried contact holes is smaller than the top diameter of the first buried contact holes, i.e., the top diameter of the plug patterns, in consideration of mis-alignment between the second buried contact hole and the plug patterns. A conductive film such as a doped polysilicon film is formed on the entire surface of the resultant structure on which the second buried contact holes are formed. The conductive film is patterned to form a storage electrode covering the second buried contact holes.

According to another embodiment of the present invention, an interlayer insulating film and a first etch stop film are sequentially formed on a semiconductor substrate. Preferably, the interlayer insulating film is a planarized silicon oxide film, e.g., a film selected from the group consisting of doped silica glass and undoped silica glass. Alternatively, the interlayer insulating film is comprised of the doped silica glass and the undoped silica glass. First buried contact holes for exposing a predetermined region of the semiconductor substrate are formed by successively patterning the first etch stop film and the interlayer insulating film. A conductive film, e.g., a doped polysilicon film, for filling the first buried contact holes is formed on the entire surface of the resultant structure on the first buried contact holes are formed. The conductive film is entire etched until the first etch stop film is exposed, to form plug patterns in the first buried contact holes. Preferably, the entire etching is performed using a chemical mechanical polishing (CMP) process. A second etch stop film is formed on the entire surface of the resultant structure on which the plug patterns are formed. The second etch stop film is patterned to form second buried contact holes for exposing the plug patterns. Here, preferably, the second etch stop film is a film selected from the group consisting of a silicon nitride film and a silicon oxide film. If mis-alignment occurs between the second buried contact holes and the plug patterns, not only the plug patterns but also their neighborhood may be exposed. Here, it is preferable that the first and second etch stop films are successively etched to form the second buried contact holes for exposing the upper sidewalls of the plug patterns. Next, a conductive film such as a doped polysilicon film is formed on the entire surface of the resultant structure on which the second buried contact holes are formed. The conductive film is patterned to form a storage electrode covering the second buried contact holes.

According to the embodiments of the present invention, the plug patterns are formed within the first buried contact holes, and the storage electrode covering the second buried contact holes for exposing the plug patterns is formed, thereby forming a stable storage electrode. Therefore, the storage electrode is prevented from being lifted during the subsequent process.

BRIEF DESCRIPTION OF THE DRAWINGS

The above objective and advantage of the present invention will become more apparent by describing in detail a preferred embodiment thereof with reference to the attached drawings in which.

DESCRIPTION OF THE PREFERRED EMBODIMENTS

Hereinbelow, preferred embodiments of the present invention will be described in detail referring to the attached drawings. Here, each drawing shows a portion of a cell array region in a DRAM device, and each cell adopts a cell having a capacitor over bit line (COB) structure for convenience of explanation. However, the present invention is not limited to the DRAM device having the COB cell, and is applicable to every semiconductor device having buried contact holes.

A cell capacitor in a DRAM device according to a first embodiment of the present invention will now be described referring to FIGS. 4 through 6.

Figure 4:
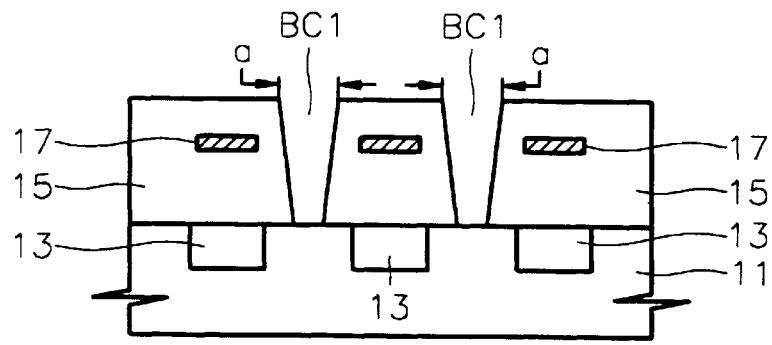
FIGS. 4 through 6 are cross-sectional views illustrating a method for forming a cell capacitor according to a first embodiment of the present invention.

Referring to FIG. 4, isolation films 13 for restricting an active region are formed in predetermined regions of a semiconductor substrate 11, and an access transistor (not shown) of a DRAM cell is formed on the active region. The isolation film 13 can be formed by the local oxidation of silicon (LOCOS) or a trench process. A first interlayer insulating film is formed on the entire surface of the resultant structure on which the access transistor has been formed. The first interlayer insulating film is patterned to form bit contact holes for exposing the source regions (or drain regions) of the access transistor. Then, bit lines 17 electrically connected with the source regions of the access transistor are formed through the bit contact holes. A second interlayer insulating film is formed on the entire surface of the resultant structure on which the bit lines 17 are formed. Here, the first and second interlayer insulating films constitute an interlayer insulating film 15. Preferably, the first interlayer insulating film is formed by forming a doped silicon oxide film such as a BPSG or PSG film and reflowing the same at a high temperature of between 800° C. and 950° C., and the second interlayer insulating film is an undoped silicon oxide film. On the contrary, the first interlayer insulating film may be an undoped silicon oxide film, and the second interlayer insulating film may be a doped silicon oxide film. Also, the first and second interlayer insulating films both can be undoped silicon oxide films or doped silicon oxide films. When the first interlayer insulating film uses the undoped silicon oxide film, the surface of the interlayer insulating film 15 comprised of the first and second interlayer insulating films is preferably planarized by planarizing the first interlayer insulating film using an etch back process or a chemical mechanical polishing (CMP) process. The interlayer insulating film 15 formed in this way, e.g., the planarized silicon oxide film, is patterned to form first buried contact holes BC1 having a top diameter indicated by reference character 'a' for exposing the drain regions (or source regions) of the access transistor. In general, the side walls of the first buried contact holes BC1 are inclined as shown in FIG. 4, so that the bottom diameter of the first buried contact hole BC1 is smaller than the top diameter (a) thereof.

Figure 5:
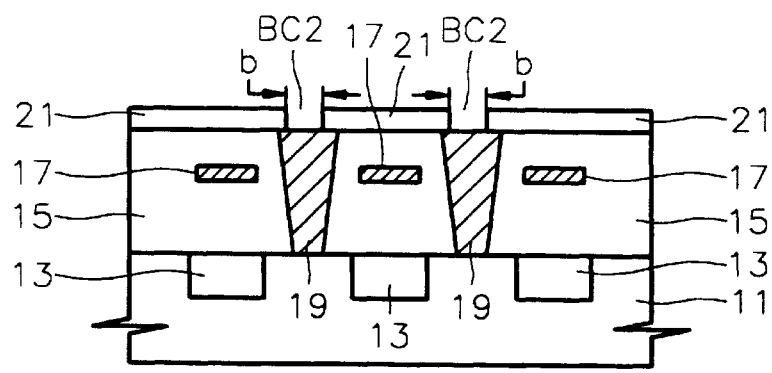

Referring to FIG. 5, a conductive film, e.g., a doped polysilicon film, for filling the first buried contact holes BC1 is formed on the entire surface of the resultant structure on which the first buried contact holes BC1 are formed. The conductive film is thickly formed to completely fill the first buried contact holes BC1. The conductive film is entirely etched until the interlayer insulating film 15 is exposed, to form plug patterns 19 inside the first buried contact holes BC1. It is preferable that the entire etching is performed by the CMP process or the etch back process. An etch stop film 21 is formed on the entire surface of the resultant structure on which the plug patterns are formed. Preferably, the etch stop film uses a material film having an etch selectivity with respect to the interlayer insulating film 15, e.g., a silicon nitride film. The etch stop film 21 is patterned to form second buried contact holes BC2 exposing the plug patterns 19. Preferably, the diameter (b) of the second buried contact hole BC2 is smaller than the top diameter of the plug pattern 19, i.e., the top diameter (a) of the first buried contact hole BC1, in consideration of mis-alignment between the second buried contact holes BC2 and the plug patterns 19.

Figure 1:
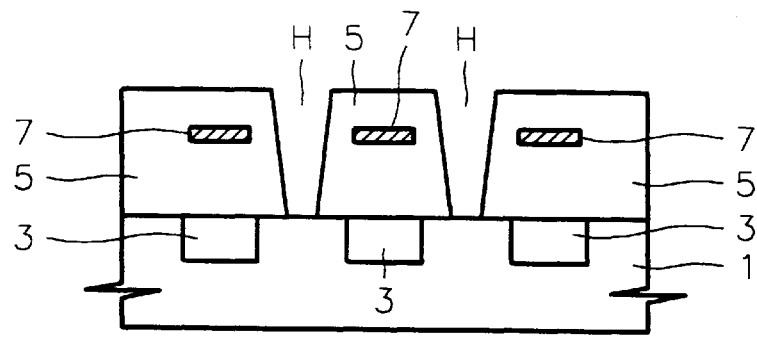
FIGS. 1 through 3 are cross-sectional views illustrating a method for forming a storage electrode constituting a conventional cell capacitor.
Figure 2:
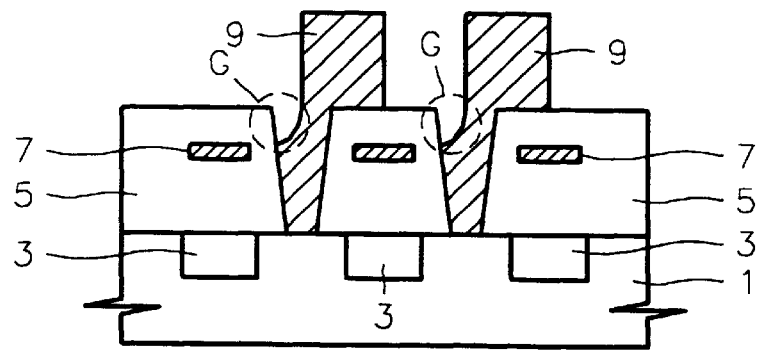
Figure 3:
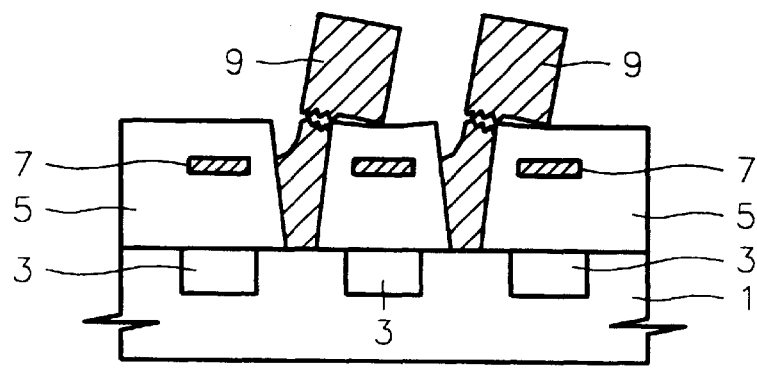
Figure 6:
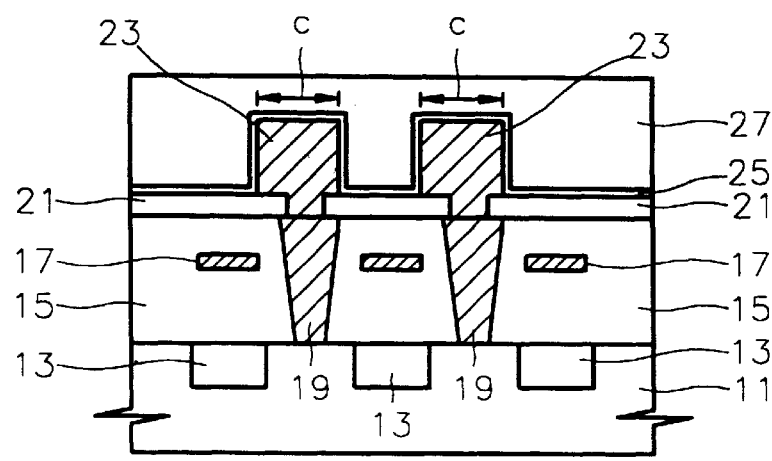

Referring to FIG. 6, a conductive film, e.g., a doped polysilicon film, for filling the second buried contact holes BC2 is formed on the entire surface of the resultant structure on which the second buried contact holes BC2 are formed. The doped polysilicon film is patterned to form a storage electrode 23 covering the second buried contact holes BC2. Here, it is preferable that the diameter (c) of the storage electrode 23 is larger than the diameter (b) of the second buried contact hole BC2 in consideration of mis-alignment between the storage electrodes 23 and the second buried contact holes BC2. Thus, the alignment margin of the storage electrode 23 is larger than in the prior art. This is because the conventional storage electrodes 9 are directly aligned in the buried contact holes H shown in FIG. 1, but the storage electrodes according to the present embodiment are directly aligned in the second buried contact holes BC2 each having a smaller diameter than the buried contact hole H. A dielectric film 25 and a plate electrode 27 are sequentially formed on the entire surface of the resultant structure on which the storage electrodes 23 are formed, thereby completing the cell capacitor. Before the dielectric film 25 is formed, the surfaces of the storage electrodes 23 may be cleaned by an oxide film etchant. The plate electrode 27 is a conductive film, e.g., a doped polysilicon film.

FIGS. 7 through 11 are cross-sectional views illustrating a method for forming a cell capacitor according to a second embodiment of the present invention.

Figure 7:
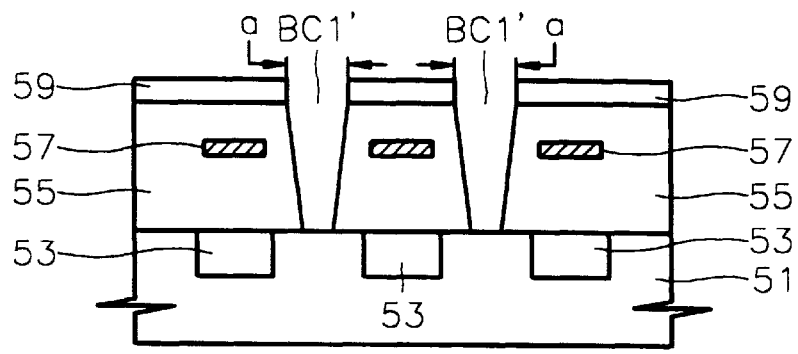
FIGS. 7 through 11 are cross-sectional views illustrating a method for forming a cell capacitor according to a second embodiment of the present invention.

Referring to FIG. 7, an isolation film 53 for restricting an active region is formed in a predetermined region of a semiconductor substrate 51. The isolation film can be formed in the same method as in the first embodiment of the present invention. An access transistor (not shown) of a DRAM cell is formed on the active region, and a first interlayer insulating film is formed on the entire surface of the resultant structure on which the access transistor is formed. The first interlayer insulating film is patterned to form bit contact holes (not shown) for exposing the source regions (or drain regions) of the access transistor. Bit lines 57 electrically connected to the source regions (or drain regions) of the access transistor via the bit contact holes are formed on the resultant structure on which the bit contact holes are formed. A second interlayer insulating film and a first etch stop film 59 are sequentially formed on the entire surface of the resultant structure on which the bit lines 57 are formed. The first and second interlayer insulating films constitute an interlayer insulating film 55. The interlayer insulating film 55 is formed of a material same as the material of the interlayer insulating film 15 in the first embodiment of the present invention. Preferably, the first etch stop film 59 is formed of a material, e.g., a silicon nitride film, having an etch selectivity with respect to the interlayer insulating film 55. Then, the first etch stop film 59 and the interlayer insulating film are successively patterned to form first buried contact holes BC1' for exposing the drain regions (or source regions) of the access transistor. The first buried contact holes BC1' may be formed by patterning the first etch stop film 59 and etching the interlayer insulating film 55 using the patterned first etch stop film 59 as an etch mask. The first buried contact hole BC1' has an inclined side wall profile as in the first embodiment of the present invention. As a result, the top diameter (a) of the first buried contact hole BC1' is larger than the bottom diameter thereof.

Figure 8:
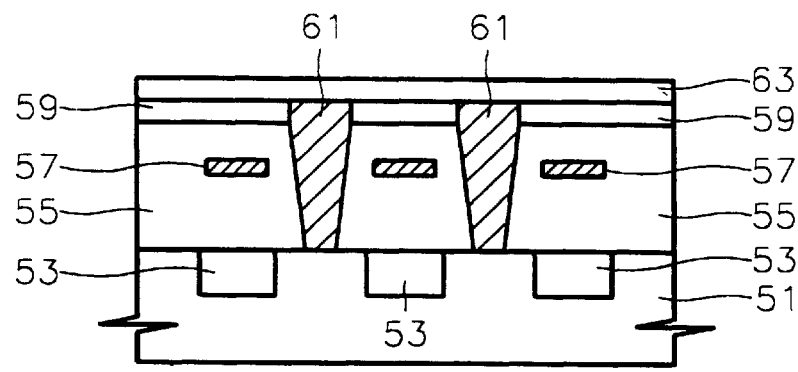

FIG. 8 is a cross-sectional view illustrating the step of forming plug patterns 61 and a second etch stop film 63. To be more specific, a conductive film, e.g., a doped polysilicon film, for filling the first buried contact holes BC1' is formed on the entire surface of the resultant structure on which the first buried contact holes BC1' are formed. The conductive film is entirely etched until the first etch stop film 59 is exposed, to form the plug patterns 61 within the first buried contact holes BC1'. Preferably, the entire etching is performed using the CMP process or the etch back process. The top diameter of the plug patterns 61 is the same as that of the first buried contact holes BC1'. The second etch stop film 63 is formed on the entire surface of the resultant structure on which the plug patterns 61 are formed. Preferably, the second etch stop film 63 is a silicon nitride film or a silicon oxide film.

Figure 9:
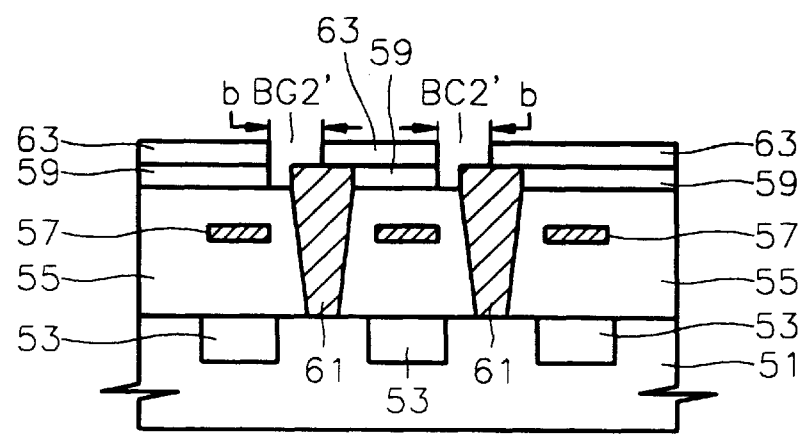

Referring to FIG. 9, the second etch stop film 63 is patterned to form second buried contact holes BC2' for exposing the plug patterns 61. At this time, the first etch stop film 59 around the plug patterns 61 may be etched by the mis-alignment between the second buried contact holes BC2' and the plug patterns 61. In this case, preferably, the exposed first etch stop film 59 is successively etched to expose the upper sidewalls of the plug patterns 61 as shown in FIG. 9. Thus, the area on which a storage electrode to be formed later contacts the plug patterns 61 is increased, to thereby compensate for a reduction in the contact resistance between the storage electrode and the plug patterns 61. Here, it is preferable that the diameter (b) of the second buried contact holes BC2' is smaller than the diameter (a) of the first buried contact holes BC1', i.e., the top diameter of the plug patterns 61, as in the first embodiment of the present invention. However, the characteristics of the second embodiment of the present invention is that the alignment margin of the second buried contact holes BC2' is greater than in the first embodiment of the present invention.

Figure 10:
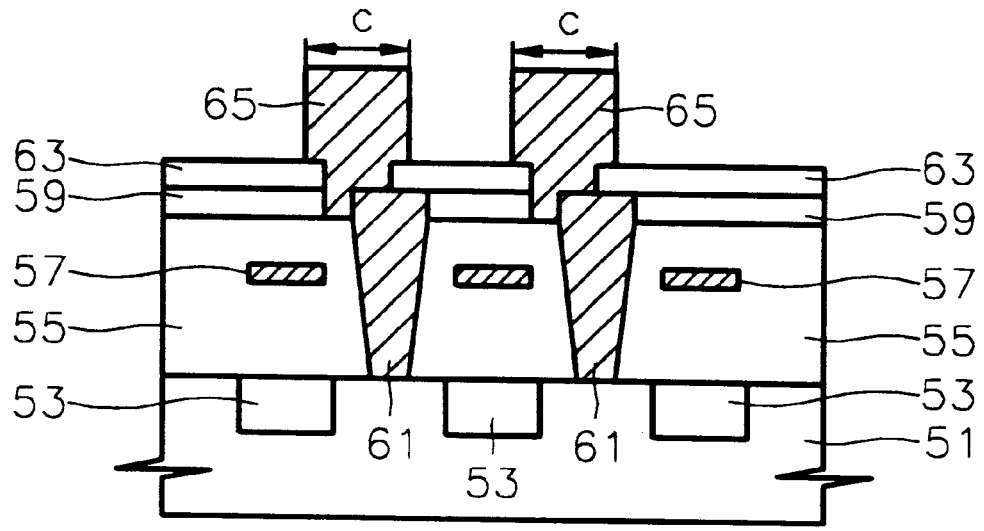

Referring to FIG. 10, a conductive film such as a doped polysilicon is formed on the entire surface of the resultant structure on which the second buried contact holes BC2' are formed. The conductive film is patterned to form storage electrodes 65 for covering the second buried contact holes BC2'. The width (c) of the storage electrodes 65 must be larger than the diameter (b) of the second buried contact holes BC2'. However, as described in the first embodiment of the present invention, the alignment margin required upon the photolithography for forming the storage electrodes 65 is greater than the prior art.

Figure 11:
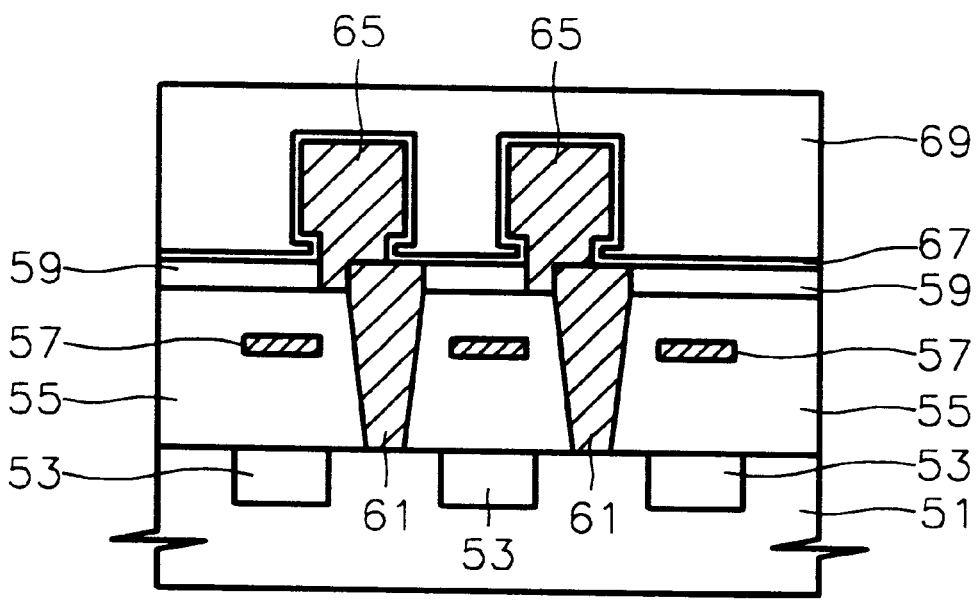

Referring to FIG. 11, the second etch stop film 63 is selectively removed from the resultant structure on which the storage electrodes 65 are formed. Then, a dielectric film 67 and a plate electrode 69 are sequentially formed on the resultant structure. Here, it is preferable that the first and second etch stop films 59 and 63 are a silicon nitride film and a silicon oxide film, respectively. However, the unshown step of removing the second etch stop film 63 from the resultant structure on which the storage electrodes 65 are formed can be omitted.

As described above, according to the preferred embodiments of the present invention, the alignment margin of the storage electrodes is increased. Thus, grooves can be prevented from forming in the second buried contact holes when the storage electrode is patterned, thus forming stable storage electrodes. As a result, the storage electrodes can be prevented from being lifted after the storage electrodes are formed.

The present invention is not limited to the above embodiments, and various modification and improvements may be effected by those skilled in the art.

What is claimed is:

1. A method for forming a cell capacitor in a DRAM device, comprising the steps of:

forming an interlayer insulating film on a semiconductor substrate;

forming first buried contact holes for exposing a part of the semiconductor substrate by patterning the interlayer insulating film;

forming plug patterns for filling the first buried contact holes;

forming an etch stop film having second buried contact holes for exposing the plug patterns, on the entire surface of the resultant structure on which the plug patterns are formed; and forming storage electrodes for covering the second buried contact holes, wherein the width of each of said plug patterns is larger than that of each of said second buried contact holes.

2. The method for forming a cell capacitor in a DRAM device as claimed in claim 1, wherein the etch stop film is a silicon nitride film.

3. The method for forming a cell capacitor in a DRAM device as claimed in claim 1, wherein the step of forming the storage electrodes comprises the substeps of:

forming a doped polysilicon film on the entire surface of the resultant structure on which the etch stop film having the second buried contact holes is formed; and patterning the doped polysilicon film to form doped polysilicon film patterns covering the second buried contact holes.

4. The method for forming a cell capacitor in a DRAM device as claimed in claim 1, wherein the step of forming the plug patterns comprises the substeps of:

forming a conductive film for filling the first buried contact holes, on the entire surface of the resultant structure on the first buried contact holes are formed; and entirely etching the conductive film until the interlayer insulating film is exposed, to form the plug patterns in the first buried contact holes.

5. The method for forming a cell capacitor in a DRAM device as claimed in claim 4, wherein the conductive film is a doped polysilicon film.

6. The method for forming a cell capacitor in a DRAM device as claimed in claim 4, wherein the entire etching is performed using a chemical mechanical polishing (CMP) process.

7. The method for forming a cell capacitor in a DRAM device as claimed in claim 1, wherein the interlayer insulating film is a planarized silicon oxide film.

8. The method for forming a cell capacitor in a DRAM device as claimed in claim 7, wherein the planarized silicon oxide film is a film selected from the group consisting of doped silica glass and undoped silica glass.

9. The method for forming a cell capacitor in a DRAM device as claimed in claim 8, wherein the doped silica glass is a film selected from the group consisting of a BPSG film and a PSG film.

10. The method for forming a cell capacitor in a DRAM device as claimed in claim 7, wherein the planarized silicon oxide film is comprised of the doped silica glass and the undoped silica glass.

11. The method for forming a cell capacitor in a DRAM device as claimed in claim 10, wherein the doped silica glass is a film selected from the group consisting of a BPSG film and a PSG film.

12. A method for forming a cell capacitor in a DRAM device, comprising the steps of:

sequentially forming an interlayer insulating film and a first etch stop film on a semiconductor substrate;

forming first buried contact holes for exposing a part of the semiconductor substrate by successively patterning the first etch stop film and the interlayer insulating film;

forming plug patterns for filling the first buried contact holes;

forming a second etch stop film having second buried contact holes for exposing the plug patterns, on the entire surface of the resultant structure on which the plug patterns are formed; and forming storage electrodes for covering the second buried contact holes.

13. The method for forming a cell capacitor in a DRAM device as claimed in claim 12, wherein the first etch stop film is a silicon nitride film.

14. The method for forming a cell capacitor in a DRAM device as claimed in claim 12, wherein the second etch stop film is a film selected from the group consisting of a silicon nitride film and a silicon oxide film.

15. The method for forming a cell capacitor in a DRAM device as claimed in claim 12, wherein the step of forming the storage electrodes comprises the substeps of:

forming a doped polysilicon film on the entire surface of the resultant structure on which the second etch stop film having the second buried contact holes is formed; and patterning the doped polysilicon film to form doped polysilicon film patterns covering the second buried contact holes.

16. The method for forming a cell capacitor in a DRAM device as claimed in claim 12, wherein the second buried contact holes expose a part of the upper surfaces and a part of the upper sidewalls of the plug patterns.

17. The method for forming a cell capacitor in a DRAM device as claimed in claim 12, wherein the width of each of said plug patterns is larger than that of each of said second buried contact holes.

18. The method for forming a cell capacitor in a DRAM device as claimed in claim 12, wherein the width of each of said storage electrodes in the upper portion of the cell capacitor is larger than that of each of said second buried contact holes.

19. The method for forming a cell capacitor in a DRAM device as claimed in claim 12, wherein the step of forming the plug patterns comprises the substeps of:

forming a conductive film for filling the first buried contact holes, on the entire surface of the resultant structure on the first buried contact holes are formed; and entirely etching the conductive film until the first etch stop film is exposed, to form the plug patterns in the first buried contact holes.

20. The method for forming a cell capacitor in a DRAM device as claimed in claim 19, wherein the conductive film is a doped polysilicon film.

21. The method for forming a cell capacitor in a DRAM device as claimed in claim 19, wherein the entire etching is performed using a chemical mechanical polishing (CMP) process.

22. The method for forming a cell capacitor in a DRAM device as claimed in claim 12, wherein the interlayer insulating film is a planarized silicon oxide film.

23. The method for forming a cell capacitor in a DRAM device as claimed in claim 22, wherein the planarized silicon oxide film is a film selected from the group consisting of doped silica glass and undoped silica glass.

24. The method for forming a cell capacitor in a DRAM device as claimed in claim 22, wherein the planarized silicon oxide film is comprised of the doped silica glass and the undoped silica glass.

25. The method for forming a cell capacitor in a DRAM device as claimed in claim 23, wherein the doped silica glass is a film selected from the group consisting of a BPSG film and a PSG film.

26. The method for forming a cell capacitor in a DRAM device as claimed in claim 24, wherein the doped silica glass is a film selected from the group consisting of a BPSG film and a PSG film.

27. A method for forming a cell capacitor in a DRAM device, comprising the steps of:

forming an interlayer insulating film on a semiconductor substrate;

forming first buried contact holes for exposing a part of the semiconductor substrate by patterning the interlayer insulating film;

forming plug patterns for filling the first buried contact holes;

forming an etch stop film having second buried contact holes for exposing the plug patterns, on the entire of the resultant structure on which the plug patterns are formed; and, forming storage electrodes for covering the second buried contact holes, wherein the width of each of said storage electrodes in the upper portion of the cell capacitor is larger than that of each of said second buried contact holes.

* * * * *